(12) United States Patent
Hill

(10) Patent No.: US 6,492,841 B2
(45) Date of Patent: Dec. 10, 2002

(54) INTEGRATED NAND AND FLIP-FLOP CIRCUIT

(75) Inventor: Anthony M. Hill, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/998,823

(22) Filed: Dec. 3, 2001

(65) Prior Publication Data

US 2002/0113624 A1 Aug. 22, 2002

Related U.S. Application Data

(60) Provisional application No. 60/258,679, filed on Dec. 27, 2000.

(51) Int. Cl.[7] ............................................. H03K 19/00
(52) U.S. Cl. ....................... 326/113; 326/16; 326/112
(58) Field of Search .......................... 326/16, 112, 113, 326/119, 121, 93, 95

(56) References Cited

U.S. PATENT DOCUMENTS 5,444,404 A * 8/1995 Ebzery ..................... 327/185
6,232,799 B1 * 5/2001 Allen et al. ................ 326/113

* cited by examiner

*Primary Examiner*—Michael Tokar
*Assistant Examiner*—Anh Q. Tran
(74) *Attorney, Agent, or Firm*—Robert D. Marshall, Jr.; W. James Brady, III; Frederick J. Telecky, Jr.

(57) ABSTRACT

A combination NAND and flip-flop circuit includes a pre-NAND scan circuit operable to receive a plurality of input signals and produce first and second output signals for receipt by a NAND gate. The plurality of signals comprises signals indicative of a first data signal, a second data signal, a scan-in signal, and a scan-enable signal. These circuits include a NAND gate having first and second inputs operable to receive the first and second output signals of the pre-NAND scan circuit. They also include a first transmission gate and a first inverter. The transmission gate receives the output of the NAND gate and the inverter receives the output of the transmission gate. The pre-NAND scan circuit is operable to produce the first and second output signals based on the plurality of input signals such that the first and second output signals are defined as described below. When the scan-enable signal is equal to a logical one then the first output signal and the second output signal are either both equal to the scan-in signal or the first output signal is equal to a logical one and the second output signal is equal to the scan-in signal. When the scan-enable signal is equal to a logical zero, then the first output signal is equal to the first data signal and the second output signal is equal to the second data signal.

15 Claims, 2 Drawing Sheets

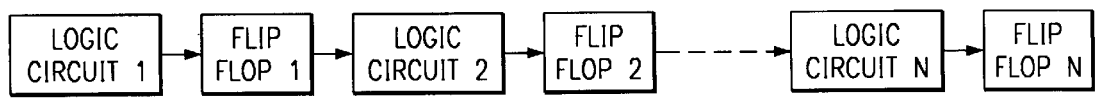
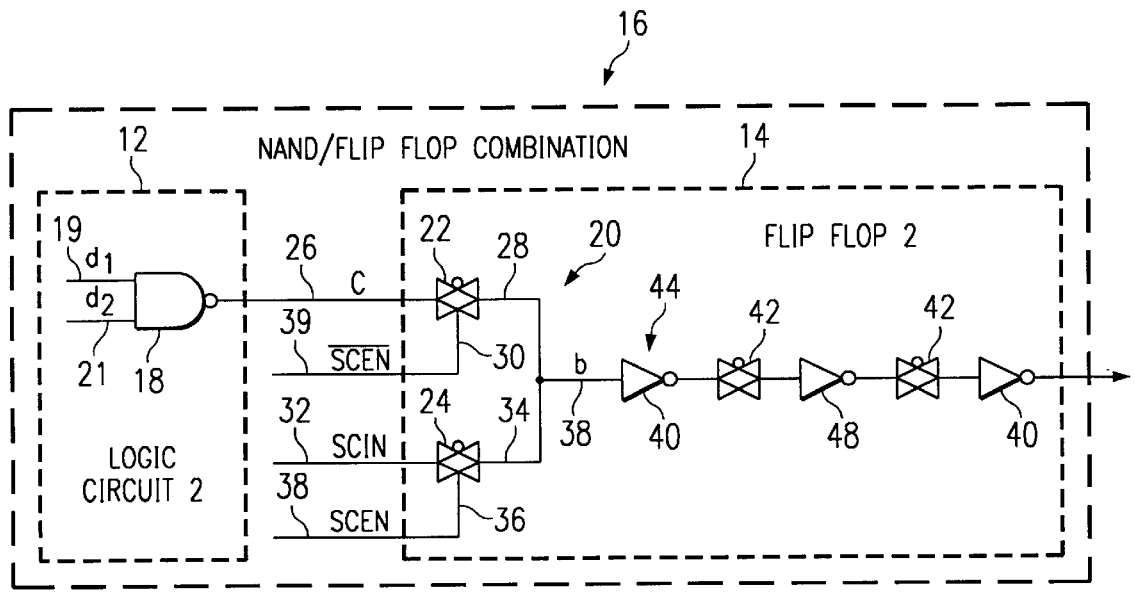
FIG. 2
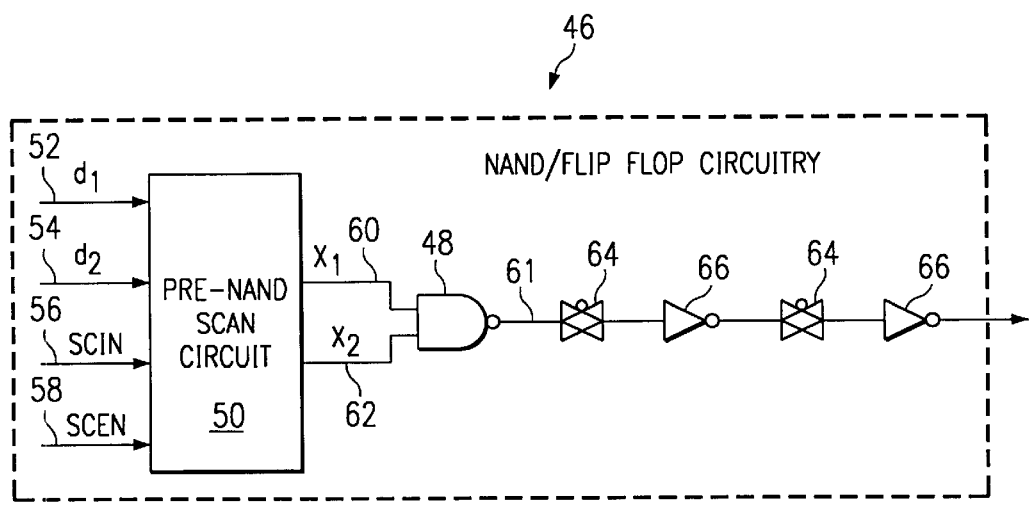
FIG. 3

INTEGRATED NAND AND FLIP-FLOP CIRCUIT

This application claims priority under 35 USC §119(e)(1) of Provisional Application No. 60/258,679, filed Dec. 27, 2000.

TECHNICAL FIELD OF THE INVENTION

This invention relates generally to logic circuits and more particularly to an integrated NAND and flip-flop circuit.

BACKGROUND OF THE INVENTION

Digital signal processors (DSPs) are becoming increasingly important in today's society, being used with many common place devices. DSPs are utilized in cell phones, personal digital assistance, appliances, and many other devices. Digital signal processors perform different functions, depending upon the type of device in which it is used. However, all digital signal processors utilize logic circuits.

Logic circuits receive an input and produce an output based on a set of specified criteria. Logic circuits are generally formed from a plurality of logic gates. Example logic gates includes AND, NAND, OR, and XOR. Logic circuits are designed to allow data to flow as rapidly as possible, but sometimes it is desirable to hold a state of an input to, or output from, a logic circuit. One way of holding the state of a particular inputs, or variable, is though the use of a flip-flop. Flip-flops are logic circuits that hold the state of a variable for a desired time period.

Requirements for faster DSPs create the desire to build DSPs that can operate at a higher clock frequency. The clock speed of DSPs is limited by the number of gates in a critical path. In other words, data can progress through only so many gates within a single clock cycle. If the number of gates is decreased, then the clock speed can be increased because less time is required to progress through the gates. Therefore, it is desirable to decrease the number of gates in logic circuits whenever possible. Removing even just one gate is considered important in today's DSPs.

Flip-flops generally utilize a series of inverters connected to transmission gates, usually starting with an inverter and ending with an inverter. A flip-flop often creates a critical path in a logic circuit. Therefore it is desirable to reduce the number of gates in flip-flops to as few as possible.

SUMMARY OF THE INVENTION

Accordingly, a need has arisen for an integrated NAND in flip-flop circuits. The present invention provides an apparatus that addresses shortcomings of prior systems and methods.

According to one embodiment of the invention, a combination NAND and flip-flop circuit includes a pre-NAND scan circuit operable to receive a plurality of input signals and produce first and second output signals for receipt by a NAND gate. The plurality of signals comprises signals indicative of a first data signal, a second data signal, a scan-in signal, and a scan-enable signal. These circuits include a NAND gate having first and second inputs operable to receive the first and second output signals of the pre-NAND scan circuit. They also include a first transmission gate and a first inverter. The transmission gate receives the output of the NAND gate and the inverter receives the output of the transmission gate. The pre-NAND scan circuit is operable to produce the first and second output signals based on the plurality of input signals such that the first and second output signals are defined as described below. When the scan-enable signal is equal to a logical one then the first output signal and the second output signal are either both equal to the scan-in signal or the first output signal is equal to a logical one and the second output signal is equal to the scan-in signal. When the scan-enable signal is equal to a logical zero, then the first output signal is equal to the first data signal and the second output signal is equal to the second data signal.

Some embodiments of the invention provides numerous technical advantages. For example, some embodiments of the invention allow reduction of the number of gates along a critical timing path in a flip-flop, resulting in a faster flip-flop and therefore faster DSPs. Such reduction in the number of gates can occur without any significant additional processing steps.

Other technical advantages are readily apparent to one skilled in the art from the following figures, descriptions, and claims.

BRIEF DESCRIPTION OF THE DRAWINGS

For a more complete understanding of the present invention and the advantages thereof, reference is now made to the following descriptions taken in connection with the a paying drawings in which:

FIG. 1 is a block diagram of portions of a digital signal processor, showing a plurality of logic circuits separated by respective flip-flops;

FIG. 2 is a block diagram of portions of one of the logic circuits of FIG. 1 and the associated flip-flop that are constructed according to conventional techniques;

FIG. 3 is a block diagram of a portion of a logic circuit and flip-flop of FIG. 1 according to the teachings of the invention, showing the use-of a pre-NAND scan circuit before a NAND gate and also showing the remainder of the flip-flop;

DETAILED DESCRIPTION OF EXAMPLE EMBODIMENTS OF THE INVENTION

Figure 4:
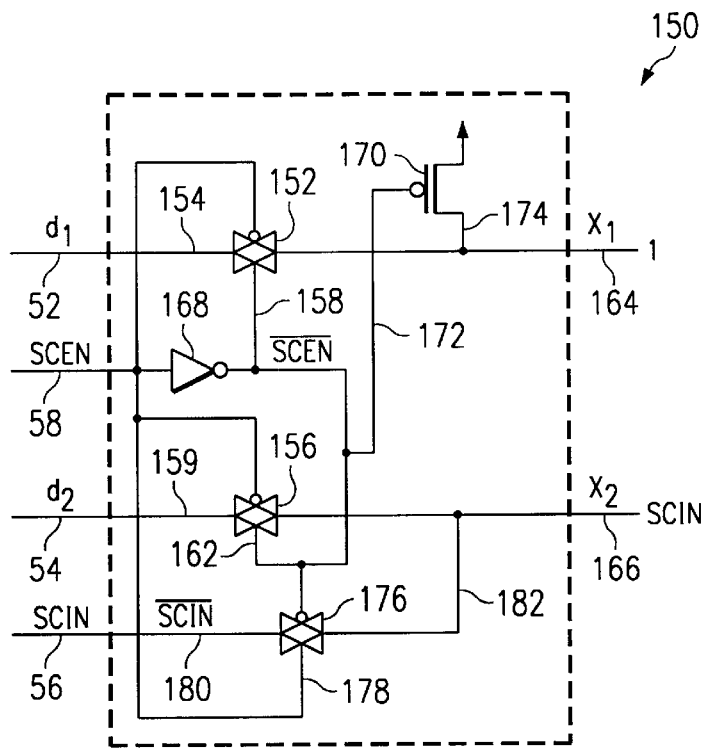
FIG. 4 is a block diagram showing one example of the pre-NAND scan circuit of FIG. 3 according to the teachings of the invention.

Embodiments of the present invention and its advantages are best understood by referring to FIGS. 1 through 5 of the drawings, like numerals being used for like and corresponding parts of the various drawings.

FIG. 1 is a block diagram of portions 10 of a digital signal processor. Portions 10 include a plurality of logic circuits 12 separated by corresponding flip-flops 14. Logic circuits 12 each include a plurality of logic gates for executing their respective functions. Example logic gates that may be included in circuits 12 include the following: NOT, BUFF, NAND, AND, NOR, OR, XOR, and other suitable logic gates. Data flows through these logic gates (not explicitly shown in FIG. 1) as fast as possible. However, flip-flops 14 are used to hold the state of the output of each logic circuit and provide the state to the next logic circuit 12 at the beginning of each clock cycle.

As described in conjunction with FIGS. 2 through 5, flip-flops 14 comprise a plurality of logic gates, generally transmission gates and inverters, to perform the state-holding function of the flip-flops; however, flip-flops 14 may include other types of logic gates, including NAND gates. In order for flip-flops 14 to properly function, data must progress through all logic gates included within flip-flops 14 during a clock cycle. If the clock speed is too fast, errors may occur, as logic gates 12 may not have completely evaluated their inputs within the clock cycle. However, due to demand of purchasers of DSPs for higher performance products, it is desirable to increase the clock speed as much as possible. Therefore, it is often desirable to reduce the number of gates in a critical path that is required to perform any particular function.

According to the teachings of the invention, the number of gates in a critical path required to perform the state-holding function of flip-flop 14 is reduced by one, as described below. This reduction allows for greater clock speeds and higher performance DSPs. Additional details of a circuit for reducing a number of logic gates for flip-flops are described in conjunction of FIGS. 3 through 5. FIG. 2 shows additional details of conventional flip-flops to facilitate that description.

FIG. 2 is a block diagram of a NAND gate and a critical path through flip-flop circuit 16 constructed according to traditional techniques. NAND gate and flip-flop circuit 16 includes components of logic circuits 12 and flip-flop 14 shown in FIG. 1. Flip-flop 14 may include additional circuitry such as feedback devices, not explicitly shown, that are not important to the critical path of flip-flop circuit 14. It is common in logic circuit construction to provide output of a logic circuit through a NAND gate, such as through a NAND gate 18. This NAND gate 18 traditionally immediately precedes the associated flip-flop 14. NAND gate 18 receives data input signals 19 and 21. It is also common to include a scan mux circuitry 20 for testing purposes as a part of flip-flop 14. Scan mux circuitry 20 allows selective transmission of either data or testing data to the remainder of flip-flop 14 for processing, as described below.

Scan circuitry 20 includes a pair of transmission gates 22 and 24. Transmission gate 22 has an input 26, an output 28, and is controlled by line 30. Transmission gate 24 has an input 32, and output 34, and is controlled by line 36. Transmission gate 22 connects its input to its output when the signal on line 30 is a logical one and disconnects its input from its output when the signal on line 30 is a logical zero. For simplicity, internal connections of opposite polarity control gates of transmission gates are not shown in many instances in the figures. Transmission gate 24 operates similarly. Traditionally, transmission gate 22 receives the output of logic circuit on line 26 and also receives a scan-in signal as input on line 32. The scan-in signal provides data that is to be used for testing purposes.

Whether the data on line 26 or the scan-in data on line 32 is passed as output of scan circuitry 20 on line 38 is determined by a scan-enable signal 38, as further described in the following examples. Setting scan-enable signal equal to a logical one causes scan-in data on line 32 to be transmitted to output 34 of transmission gate 24. Additionally, the complement 39 of scan-enable signal 38 (which in this example is equal to a logical zero) disconnects input 26 from output 28; therefore transmission gate 22 does not allow transmission of data on line 26 to line 28. Conversely, setting scan-enable signal 38 equal to a logical zero results in transmission gate 24 preventing data flow and transmission gate 22 allowing data flow. Therefore, scan-enable signal 38 is set to a logical zero for normal operation and is set to a logical one for testing.

The remainder of the illustrated portion of flip-flop 14 utilizes a plurality of inverters 40 and transmission gates 42 to perform the state-holding function of flip-flop 14. Inverters 40 include a first inverter 44. Transmission gates 42 are controlled by a signal that is not explicitly shown.

According to the teachings of the invention, a NAND gate, such as NAND gate 18, replaces inverter 44 and appropriate circuitry is included within flip-flop 14 before the NAND gate to allow both testing and normal operation. By doing so, the number of gates required in the critical path of a NAND gate and flip-flop combination is reduced by one. Such reduction in the number of gates allows for faster clock speeds resulting in higher performance DSPs. Additional details of example embodiments of the invention are provided in conjunction with FIGS. 3 through 5.

FIG. 3 is a block diagram of a NAND and flip-flop circuit 46 according to the teachings of the present invention. NAND and flip-flop circuit 46 includes a NAND gate 48. NAND gate 48 replaces inverter 44 of circuit 16 of FIG. 2. Furthermore, NAND gate 48 serves similar roles as NAND gate 18. Therefore, a corresponding NAND gate such as NAND gate 18 is not required in the logic circuit preceding flip-flop circuit 46. Prior to the invention, there were two reasons why inverter 44 could not simply be removed to reduce the number of gates in flip-flop 14. First, such removal may lead to a long-length line preceding transmission gate 24, which could lead to noisy transmission. Second, doing so would result in two sequential transmission gates, such as transmission gate 22 and transmission gate 42, which is undesirable because they result in slow operation.

NAND and flip-flop circuit 46 also includes a pre-NAND scan circuit 50. Pre-NAND scan circuit 50 has four data input lines: a first data input line 52, a second data input line 54, a scan-in input line 56, and a scan-enable input line 58. First data input line 52 receives a signal indicative of a first data signal. Second data input line 54 receives a signal indicative of a second data input signal. Scan-in input line 56 receives a signal indicative of a scan-in input signal. Scan-enable input line 58 receives a signal indicative of a scan-enable signal. The first data signal, associated with data input line 52, and the second data signal, associated with data input line 54, are analogous to the data signals received by NAND gate 18 in conventional circuits, which are received at inputs 19 and 21 (FIG. 2). The scan-in signal associated with scan-in input line 56 is analogous to the scan-in signal associated with line 32 in conventional circuits. The scan-enable signal associated with scan-enable input line 58 is analogous to scan-enable signal 38, shown in FIG. 2.

Scan-in input line 56 may receive a scan-in signal, the complement of the scan-in signal, or other suitable indications of the scan-in signal. Scan-enable input line 58 may receive a scan-enable signal, the complement of the scan-enable signal, or other suitable indications of the scan-enable signal. First data input line 52 may receive a first data signal, the complement of the first data signal, or other suitable indications of the first data signal. Second data input line 54 may receive a second data signal, the complement of the second data signal or other suitable indications of the second data signal. Pre-NAND scan circuit 50 produces data outputs 60 and 62, also represented by X1 and X2, respectively.

Figure 5:
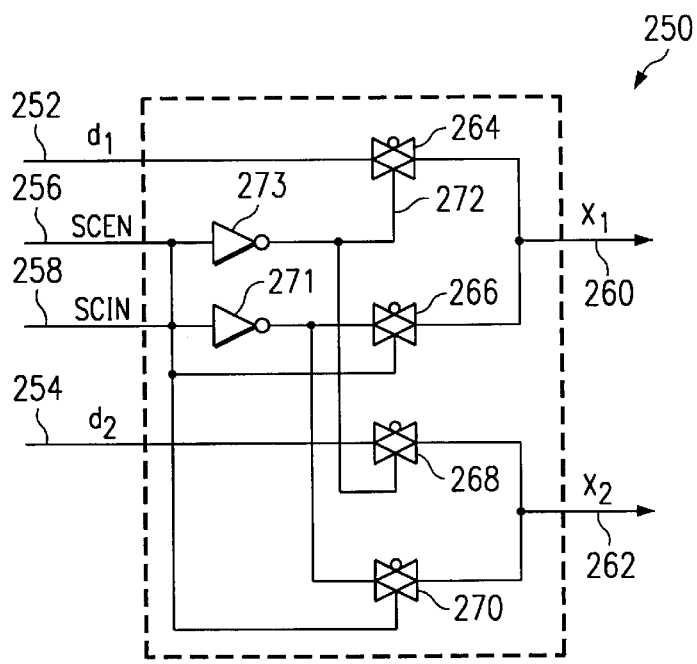
FIG. 5 is a block diagram showing another example of the pre-NAND scan circuit of FIG. 3 according to the teachings of the invention.

Pre-NAND scan circuit 50 allows both passing through of data received at input lines 52 and 54 as well as testing through signals received at NAND input line 56 and scan-enable line 58. Therefore, depending on the signal received at scan-enable input line 58, pre-NAND scan circuit 50 either allows testing or allows data to be passed through. Pre-NAND scan circuit 50 includes appropriate logic to implement this function. Two examples of such logic are shown in FIGS. 4 and 5.

Pre-NAND scan circuit 50 produces output based on received inputs according to the following Table 1. In the table, an "x" indicates "do not care" for the associated value of data.

TABLE 1

Pre-NAND Scan Circuit Logic Table

| FIG. | $d_2$ | $d_2$ | Scan-enable | Scan-in | $x_1$ | $x_2$ | NAND output |
|---|---|---|---|---|---|---|---|
| FIG. 5 | x | x | 1 | scin | scin | scin | not scin |
| FIG. 4 | x | x | 1 | scin | 1 | scin | not scin |
| FIG. 4 and 5 | $d_2$ | $d_2$ | 0 | x | $d_1$ | $d_2$ | NAND $(d_1, d_2)$ |

As shown in Table 1, if the scan-enable signal is equal to a logical one, output 62 is equal to the scan-in signal and output 60 is equal to either the scan input signal or equal to a logic one. Therefore, according to the teachings of the invention, output 60 may have a value equal to either one or the scan input signal when the scan-enable signal is equal to a logical one. Thus, suitable logic is incorporated in pre-NAND scan circuit 50 to achieve this logic table. As further shown in Table 1, when the scan-enable signal is equal to zero, the pre-NAND circuit 60 passes through the signals at first data input line 52 and second data input line 54 to the outputs 60 and 62, respectively.

NAND and flip-flop circuit 46 also includes, in this example, two transmission gates 64 and two inverters 66, with each inverter 66 receiving the output of transmission gate 54 and a first transmission gate 64 receiving the output of NAND gate 48. However, any suitable number of transmission gates and inverters may be utilized.

By replacing the inverter that may normally immediately follow a mux scan circuit with NAND gate 48, the inverter function and the NAND gate function can be combined to a single gate, thus reducing by one the number of the gates needed to achieve the overall function of NAND gate and flip-flop circuit 46. The function of NAND gate and flip-flop circuit 46 can be achieved by designing pre-NAND scan circuit 50 to conform to the logic of Table 1. FIGS. 4 and 5 show two examples of appropriate logic of pre-NAND scan circuit 50. Other suitable combinations of logic may also be used.

FIG. 4 is a block diagram showing a pre-NAND scan circuit 150 suitable for use in the present invention. Pre-NAND scan circuit 150 includes a transmission gate 152 receiving a first data signal from line 154 as its input and a transmission gate 156 receiving a second data signal from line 159 as its input. Transmission gate 152 is controlled at line 158 by the complement of a scan-enable signal. The scan-enable signal is received at a scan-enable input line 160. Transmission gate 156 is controlled on line 162 by the complement of the scan-enable signal. Transmission gate 156 is controlled by the complement of the scan-enable signal at line 158. The complement of the scan-enable signal is produced by an inverter 168. The output of transmission gate 152 is disconnected from its input when the scan-enable signal is set to a logical one and its output is connected to its input when the scan-enable signal is set to a logical zero. The output of transmission gate 156 is disconnected from its input when the scan-enable signal is set to a logical one and its output is connected to its input when the scan-enable signal is set to a logical zero.

Pre-NAND scan circuit 150 also includes a P-type field-effect transistor 170, which is controlled at its gate 172 by the complement of the scan-enable signal. Transistor 170 has a drain 174 connected to output 164 of pre-NAND scan circuit 150.

Pre-NAND scan circuit 150 also includes a transmission gate 176 controlled on line 178 by the scan-enable signal received at input line 58. Transmission gate 176 receives as an input at line 180 a scan-in signal and has its output 180 connected to output 166 of pre-NAND scan circuit 150.

Transmission gates 152, 156, and 176 each also receive the complement of their respective control signal at their respective opposite polarity control gate, as shown in FIG. 4.

In operation, pre-NAND scan circuit 150 produces outputs 164 and 166 from inputs received at lines 52, 54, 56, and 58 that correspond to the logic of Table 1, as described below. When the scan-enable signal received at scan-enable input line 58 equals a logical zero, corresponding to normal data operation, transmission gates 152 and 156 have their outputs connected to their inputs. In addition, transistor 174, which is a P-type transistor, receives at its gate 172 the complement of the scan-enable signal, which is a logical one. Therefore, transistor 170 is "off" and output 164 is equal to the data signal received at first data input line 52. Output 166 is equal to the value received at data input line 54 because transmission gate 156 passes its input to its output. Therefore, for the condition when the scan-enable signal is equal to a logical zero, first data output 164 is equal to the signal received at first data input line 52 and second data output 166 is equal to the signal received at second data input line 54, which corresponds to the logic shown in Table 1.

When the scan-enable signal received at scan-enable input line 160 is equal to a logical one, corresponding to a testing condition, processing occurs as follows. Transmission gate 152 and transmission gate 156 receive a logical zero at their control lines 158 and 162 respectively; therefore, the input of transmission gate of 152 and 156 are disconnected from their outputs. In addition, gate 172 of transistor 170 receives a logical zero, which turns transistor 172 "on." Therefore, the voltage at line 174 is equal to a logical one; thus, output 164 is equal to a logical one. Transmission gate 176 is turned on by the scan-enable signal at line 178. Therefore, output 182 of transmission gate 176 is connected to input 180 and output 166 of pre-NAND scan circuit 150 is equal to the scan-in signal received at line 56. Thus, pre-NAND scan circuit 150 corresponds to the logic of Table 1.

Pre-NAND circuit 150 receives input signals at input lines 52, 54, 56, and 58 and produces outputs 164 and 166 corresponding to the logic of Table 1. This logic function provides NAND and flip-flop circuit 48 appropriate input at lines 60 and 62 (FIG. 3) that results in a NAND and flip-flop circuit 46 that performs the overall function that is performed by conventional circuits, but does so using one less logic gate. The reduction in logic gate number allows faster clock speeds and enhanced performance of associated digital signal processors and other devices. Invertor 168 does not add a gate in the critical path because it is in parallel with the critical path.

FIG. 5 is a block diagram of another example of a pre-NAND scan circuit suitable for use with the present invention. Pre-NAND scan circuit 250 includes a first data input line 252 and a second data input line 254. Pre-NAND scan circuit 250 also includes a scan-enable input line 256 and scan-in input line 258. First and second data input lines 252 and 254 receive first and second data input signals, respectively. Scan-enable input line 256 receives a scan-enable signal and scan-in input line 258 receives a scan-in signal. Pre-NAND scan circuit 250 produces a first output 260 and a second output 262. Outputs 260 and 262 are a function of the signals received at input lines 252, 254, 256, and 258, described by the logic shown in Table 1.

Pre-NAND scan circuit 250 includes transmission gates 264, 266, 268, and 270. The input of transmission gate 264 is connected to line 252 and its output is connected to data output 260. Transmission gate 264 is controlled on line 272 by the complement of a scan-enable signal received at scan-enable input line 256. This complement is produced by an inverter 273. Transmission gate 268 is similar, but has its input connected to data input line 254 and its output connected to data output 262. Transmission gate 266 has its input connected to the complement of the scan-in input signal received at scan-in input line 258 and its output connected to data output 260. The complement of the scan-in input signal received at line 258 is produced by an inverter 271. Transmission gate 270 also has its input connected to the complement of the signal received at line 258, but its output is connected to data output 262. Transmission gates 266 and 270 are controlled by the scan-enable signal received at scan-enable input line 256.

Inverters 271 and 273 do not increase the overall number of gates in the critical path of NAND and flip-flop circuit 46 because they are in parallel with the critical path.

The operation of pre-scan circuit is described as follows. A scan-enable signal is received on scan-enable input line 256 that is equal to a logical zero, indicating normal operation. In response, transmission gates 264 and 268 are turned on and transmission gates 266 and 270 are turned off. Therefore, output 260 is equal to the data signal received at line 252 and output 262 is equal to the data signal received at line 254. If the scan-enable signal received at scan-enable input 256 is equal to a logical one, indicating that testing should occur, transmission gates 264 and 268 are closed and transmission gates 266 and 270 are open. Therefore, output 260 is equal to the scan-in signal received at line 258 and so is output 262. Therefore, pre-NAND scan circuit 250 corresponds-to the logic of Table 1, and therefore the resulting NAND and flip-flop circuit 46 is able to perform the same overall function as the corresponding conventional circuit, but uses one less gate to do so. Therefore, digital signal processors and other devices may be produced at higher clock speeds utilizing the teachings of the invention.

Although the present invention and its advantages have been described in detail, it should be understood that various changes, substitutions, and alterations can be made therein without departing from the spirit and scope of the present invention as defined by the appended claims.

What is claimed is:

1. A combination NAND and flip-flop circuit comprising:
   a pre-NAND scan circuit operable to receive a plurality of input signals and produce first and second output signals for receipt by a NAND gate, the plurality of signals comprising signals indicative of a first data signal, a second data signal, a scan-in signal, and a scan-enable signal;
   a NAND gate having first and second inputs operable to receive the first and second output signals of the pre-NAND scan circuit;
   a first transmission gate and a first inverter, the first transmission gate receiving the output of the NAND gate and the first inverter receiving the output of the first transmission gate; and
   wherein the pre-NAND scan circuit is operable to produce the first and second output signals based on the plurality of input signals such that the first and second output signals are defined as follows:
   when the scan-enable signal is equal to a logical one then
      (i) the first output signal and the second output signal are both equal to the scan-in signal; or
      (ii) the first output signal is equal to a logical one and the second output signal is equal to the scan-in signal; and
   when the scan-enable signal is equal to a logical zero then the first output signal is equal to the first data signal and the second output signal is equal to the second data signal.

2. The circuit of claim 1, and further comprising a second transmission gate and second inverter, the second transmission gate receiving the output of first inverter and the second inverter receiving the output of the second transmission gate.

3. The circuit of claim 1, wherein the signal indicative of the scan-enable signal comprises the complement of the scan-enable signal.

4. The circuit of claim 1, wherein the signal indicative of the scan-enable signal comprises the scan-enable signal.

5. The circuit of claim 1, wherein the signal indicative of the scan-in signal comprises the complement of the scan-in signal.

6. The circuit of claim 1, wherein the signal indicative of the scan-in signal comprises the scan-in signal.

7. The circuit of claim 1, wherein the pre-NAND scan circuit comprises:
   a third transmission gate operable to receive a first data signal and controlled by the complement of a scan-enable signal, the third transmission gate having an output connected to the first input of the NAND gate;
   a fourth transmission gate operable to receive a second data signal and controlled by the complement of a scan-enable signal, the fourth transmission gate having an output connected to the second input of the NAND gate;
   a fifth transmission gate operable to receive the complement of a scan-in signal and controlled by the scan-enable signal, the fifth transmission gate having an output connected to the second input of the NAND gate;
   a PFET having a drain connected to the output of the third transmission gate and controlled by the complement of the scan-enable signal.

8. The circuit of claim 1, wherein the pre-NAND scan circuit comprises a third transmission gate operable to receive a first data signal and controlled by a scan-enable signal, the third transmission gate having an output connected to the first input of the NAND gate;
   a fourth transmission gate operable to receive a scan-in signal and controlled by the scan-enable signal, the fourth transmission gate having an output connected to the first input of the NAND gate;
   a fifth transmission gate operable to receive a second data signal and controlled by the scan-enable signal, the fifth transmission gate having an output connected to the second input of the NAND gate; and
   a sixth transmission gate operable to receive the scan-in signal and controlled by the scan-enable signal, the sixth transmission gate having an output connected to the second input of the NAND gate.

9. A flip-flop circuit comprising:

a NAND gate having first and second inputs;

a first transmission gate receiving the output of the NAND gate;

a first inverter receiving the output of the first transmission gate;

a second transmission gate receiving the output of the first inverter;

a second inverter receiving the output of the second-transmission gate;

a third transmission gate operable to receive a first data signal and controlled by the complement of a scan-enable signal, the third transmission gate having an output connected to the first input of the NAND gate;

a fourth transmission gate operable to receive a second data signal and controlled by the complement of a scan-enable signal, the fourth transmission gate having an output connected to the second input of the NAND gate;

a fifth transmission gate operable to receive the complement of a scan-in signal and controlled by the scan-enable signal, the fifth transmission gate having an output connected to the second input of the NAND gate; and a P-type field effect transistor having a drain connected to the output of the third transmission gate and controlled by the complement of the scan-enable signal.

10. The flip-flop circuit of claim 9, and further comprising an inverter receiving the scan-enable signal and producing the complement of the scan-enable signal.

11. The flip-flop circuit of claim 9, and further comprising a third inverter receiving the scan-in signal and producing the complement of the scan-in signal.

12. The flip-flop circuit of claim 9, wherein the first and second transmission gates each comprise an NMOS and a PMOS transistor.

13. A flip-flop circuit comprising:

a NAND gate having first and second inputs;

a first transmission gate receiving the output of the NAND gate;

a first inverter receiving the output of the first transmission gate;

a second transmission gate receiving the output of the first inverter;

a second inverter receiving the output of the second-transmission gate;

a third transmission gate operable to receive a first data signal and controlled by a scan-enable signal, the third transmission gate having an output connected to the first input of the NAND gate;

a fourth transmission gate operable to receive a scan-in signal and controlled by the complement of the scan-enable signal, the fourth transmission gate having an output connected to the first input of the NAND gate;

a fifth transmission gate operable to receive a second data signal and controlled by the scan-enable signal, the fifth transmission gate having an output connected to the second input of the NAND gate; and a sixth transmission gate operable to receive the scan-in signal and controlled by the complement of the scan-enable signal, the sixth transmission gate having an output connected to the second input of the NAND gate.

14. The flip-flop circuit of claim 9, wherein the first and second transmission gates each comprise an NMOS and a PMOS transistor.

15. The flip-flop of claim 13, and further comprising a third inverter receiving the scan-enable signal and producing the complement of the scan-enable signal.

* * * * *